United States Patent
Fu et al.

(10) Patent No.: US 10,825,545 B2
(45) Date of Patent: Nov. 3, 2020

(54) MEMORY DEVICE LOOPBACK SYSTEMS AND METHODS

(71) Applicant: Micron Technology, Inc., Boise, ID (US)

(72) Inventors: Hui Fu, San Jose, CA (US); Aaron Preston Boehm, Boise, ID (US); Matthew Alan Prather, Boise, ID (US); George Edward Pax, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 15/944,455

(22) Filed: Apr. 3, 2018

(65) Prior Publication Data
US 2018/0294044 A1    Oct. 11, 2018

Related U.S. Application Data

(60) Provisional application No. 62/482,052, filed on Apr. 5, 2017.

(51) Int. Cl.
*G11C 29/48* (2006.01)
*G11C 29/04* (2006.01)

(52) U.S. Cl.
CPC ...... *G11C 29/48* (2013.01); *G11C 2029/0409* (2013.01)

(58) Field of Classification Search
CPC ............ G11C 29/48; G11C 2029/0409; G11C 29/022; G11C 2029/5602; G11C 29/52; G11C 29/1201; G01R 31/31716
USPC ......................................................... 714/764
See application file for complete search history.

(56) References Cited

U.S. PATENT DOCUMENTS

| | | | |
|---|---|---|---|
| 6,016,525 A * | 1/2000 | Corrigan | G06F 11/2221 710/100 |
| 8,209,680 B1 * | 6/2012 | Le | G06F 9/45558 717/174 |
| 9,043,662 B2 * | 5/2015 | Selking | G11C 29/02 714/718 |

(Continued)

FOREIGN PATENT DOCUMENTS

EP    2558945 B1    12/2014

OTHER PUBLICATIONS

PCT International Search Report & Written Opinion for PCT Application No. PCT/US2018/026121 dated Jul. 31, 2018; 10 Pages.

*Primary Examiner* — James C Kerveros
(74) *Attorney, Agent, or Firm* — Fletcher Yoder, P.C.

(57) ABSTRACT

One embodiment of the present disclosure describes a loopback network including a loopback datapath and a plurality of memory devices. The plurality of memory devices may include a first memory device coupled to a first trunk connector of the first loopback datapath via a first branch connector. The plurality of memory devices may also include a second memory device coupled to the first trunk connector of the first loopback datapath via a second branch connector. When data communicated with the first memory device is targeted by loopback parameters, the first memory device may output a first loopback data signal generated based at least in part on the first data to the first loopback datapath, and the second memory device may block output from the second memory device to the first loopback datapath.

19 Claims, 6 Drawing Sheets

(56) References Cited

U.S. PATENT DOCUMENTS

| | | |
|---|---|---|
| 10,346,244 B2* | 7/2019 | Brown ............... G06F 11/1044 |
| 2010/0077267 A1* | 3/2010 | Perego ............... G06F 13/1678 |
| | | 714/716 |
| 2010/0251042 A1 | 9/2010 | Selking |
| 2011/0035560 A1* | 2/2011 | Bodrozic ......... G01R 31/31716 |
| | | 711/155 |
| 2011/0131374 A1 | 6/2011 | Noeldner et al. |
| 2011/0283060 A1 | 11/2011 | Ware et al. |
| 2015/0088437 A1* | 3/2015 | Lin .................... G01R 31/2834 |
| | | 702/58 |
| 2016/0284424 A1* | 9/2016 | Das ....................... G11C 29/42 |
| 2018/0136866 A1* | 5/2018 | Eugenio ................ G06F 11/22 |
| 2018/0277236 A1* | 9/2018 | Jin ........................ G11C 29/38 |
| 2018/0300208 A1* | 10/2018 | Oruganti ............... G06F 3/0619 |
| 2019/0066816 A1* | 2/2019 | Dono .................... G11C 29/36 |
| 2019/0179560 A1* | 6/2019 | Moon .................. G11C 7/1018 |
| 2020/0126609 A1* | 4/2020 | Kim .................... G11C 29/022 |

\* cited by examiner

MEMORY DEVICE LOOPBACK SYSTEMS AND METHODS

CROSS-REFERENCE TO RELATED APPLICATIONS

This application is a Non-Provisional application claiming priority to U.S. Provisional Patent Application No. 62/482,052, entitled "MEMORY DEVICE LOOPBACK SYSTEMS AND METHODS," filed Apr. 5, 2017, which is herein incorporated by reference in its entirety for all purposes.

BACKGROUND

The present disclosure relate generally to memory devices and, more particularly, to monitoring operation of a memory device.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include electronic devices that, in operation, communicate information via electrical signals. For example, a computing system may include a processor communicatively coupled to a memory device, such as a dynamic random-access memory (DRAM) device implemented on dual in-line memory module (DIMM). In this manner, the processor may communicate with the memory device, for example, to retrieve executable instructions, retrieve data to be processed by the processor, and/or store data output from the processor.

To facilitate improving operational reliability, operation of a memory device may be monitored, for example, by a host controller to facilitate debugging operation of the memory device and/or performing diagnostics on operation of the memory device. In some instances, operation of a memory device may be monitored based on analysis of signals indicative of data input to and/or output from the memory device. In other words, accuracy of operational monitoring may be affected by integrity of such signals returned from the memory device.

BRIEF DESCRIPTION OF THE DRAWINGS

Various aspects of this disclosure may be better understood upon reading the following detailed description and upon reference to the drawings in which.

DETAILED DESCRIPTION

Figure 1:
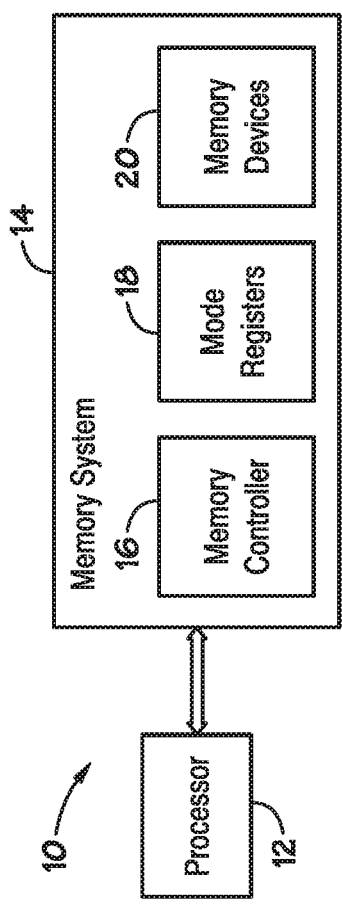
FIG. 1 is a block diagram of a computing system that includes a processor and memory devices, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

To facilitate monitoring operation of memory, the present disclosure provides techniques for implementing a loopback datapath (e.g., network) between one or more memory devices, which enables transmission of a loopback signal indicative of memory device operation. In some embodiments, a memory device may generate a loopback signal based at least in part on a data (e.g., DQ) signal and/or a strobe (e.g., DQS) signal output, for example, to the processor. As operating frequencies continue to increase to facilitate providing increased data transfer speeds, in some embodiments, a memory device may generate a loopback data signal with a lower frequency compared to a corresponding data signal, for example, by sampling every fourth bit using a loopback strobe signal that has one fourth the frequency of a corresponding strobe signal. A host controller may monitor (e.g., debug and/or diagnose) operation of the target memory device through the slower loopback signal (e.g., as opposed to the high frequency data signal) transmitted between the memory device and the host controller via a loopback datapath. In some instances, the host controller is included in and/or replaced by test, or characterization, equipment used to verify operation, or performance, for example, during manufacturing and prior to installation of the targeted memory device in a computing system and/or on a memory module, or for debug purpose in case of a system/device underperforming or not performing to expectations.

In some embodiments, a loopback datapath may be implemented using one or more signal carriers (e.g., wires, cables, or conductive traces). For example, when a memory device is implemented on a memory module, a first portion of the loopback datapath may be implemented via conductive traces formed on the memory module. Additionally, a second portion of the loopback datapath may be implemented via a connector and a cable coupled between the memory module and the host controller.

A loopback datapath may be implemented to connect multiple memory devices, for example, with a loopback pin on a memory module communicatively coupled to the host controller. However, transmitting a loopback signal through multiple memory devices may introduce distortion on the loopback signal, for example, due to process variations, voltage variations, and/or temperature variations. In fact, such variations may cause loopback signal distortion due to the inherent nature of components within a memory device. Furthermore, in some instances, the time the loopback signal takes to transition from a logical high to a logical low may differ from the time the loopback signal takes to transition from a logical low to a logical high. When connected in series, such timing differences may propagate through multiple memory devices. For example, such timing differences may result in a slow edge of a received loopback signal being used to drive a slow edge of a generated loopback signal, thereby stacking the effect of the timing differences. At least in some instances, distortion may affect signal integrity of the loopback signal and, thus, memory diagnostics and/or debugging performed based on the loopback signal. Additionally or alternatively, transmitting signals through multiple memory devices may increase complexity of a design and may have costs associated with using pin resources on the memory device to transmit the signals.

Thus, to facilitate improving memory diagnostics and/or debugging, the present disclosure provides techniques to facilitate improving loopback signal integrity, for example, by implementing a loopback network (e.g., datapath) that enables a targeted memory device to transmit loopback signals directly to an output pin. In this manner, loopback signal distortions caused from timing differences and/or the inherent nature of components within memory devices may be mitigated through the direct transmission of the loopback signals from the targeted memory device to the output pin, for example, effectively bypassing other memory devices in the loopback network, while simplifying design of the memory device. In some embodiments, the output pin may be a dedicated loopback pin, for example, formed on a memory module, such that a loopback signal from a targeted memory device may transmit from the memory module without interfering with data transmission to and/or from storage circuitry of the targeted memory device or any suitable component of the memory module. Additionally or alternatively, the output pin may be a data pin and/or a strobe pin implemented with a multiplexing selection circuit that enables selectively using the output pin for the loopback signals or for other (e.g., data or strobe) signals.

To help illustrate, an example of a computing system 10 that includes a processor 12 and a memory system 14 is shown in FIG. 1. The computing system 10 may be any suitable computing product, such as a handheld computing device, a tablet computing device, a notebook computing device, or the like. It should be appreciated that the depicted computing system 10 is merely intended to be illustrative and not limiting. In particular, in some embodiments, depicted components may be combined into fewer components or separated into additional components, for example, with the processor 12 including a memory controller 16.

The processor 12 may execute instruction stored in the memory system 14 to perform operations in the computing system 10. As such, the processor 12 may include one or more general purpose microprocessors, one or more application specific processors (ASICs), one or more field programmable logic arrays (FPGAs), or any combination thereof. Additionally, when implemented to monitor operation of the memory system 14, the processor 12 may include a host controller.

Furthermore, the memory system 14 may include the memory controller 16, one or more mode registers 18, and one or more memory devices 20. In some embodiments, the memory controller 16 may generally control operation of the memory system 14, for example, to control external access to the memory devices 20 implemented in the memory system 14. Additionally, the mode registers 18 may store data indicative of an operational mode. For example, the mode registers 18 may indicate whether to operate a memory device 20 in a normal mode or a loopback mode, in which the memory device 20 operates to output loopback signals.

The memory devices 20 may include one or more tangible, non-transitory, computer-readable media that store instructions executable by and/or data to be processed by the processor 12. In some embodiments, storage provided by one or more memory devices 20 may be logically organized into one or more banks. Additionally, in some embodiments, one or more memory devices 20 may be physically organized into one or more memory modules. For example, a memory device 20 may be a dynamic random-access memory (DRAM) device implemented on a dual in-line memory module (DIMM). In this example, the DIMM may include multiple memory devices 20 physically coupled on a first (e.g., front) surface and a second (e.g., back) surface of a printed circuit board (PCB). Additionally, the memory devices 20 may be communicatively coupled via traces formed on the printed circuit board, for example, to external pins of the DIMM.

Figure 2:
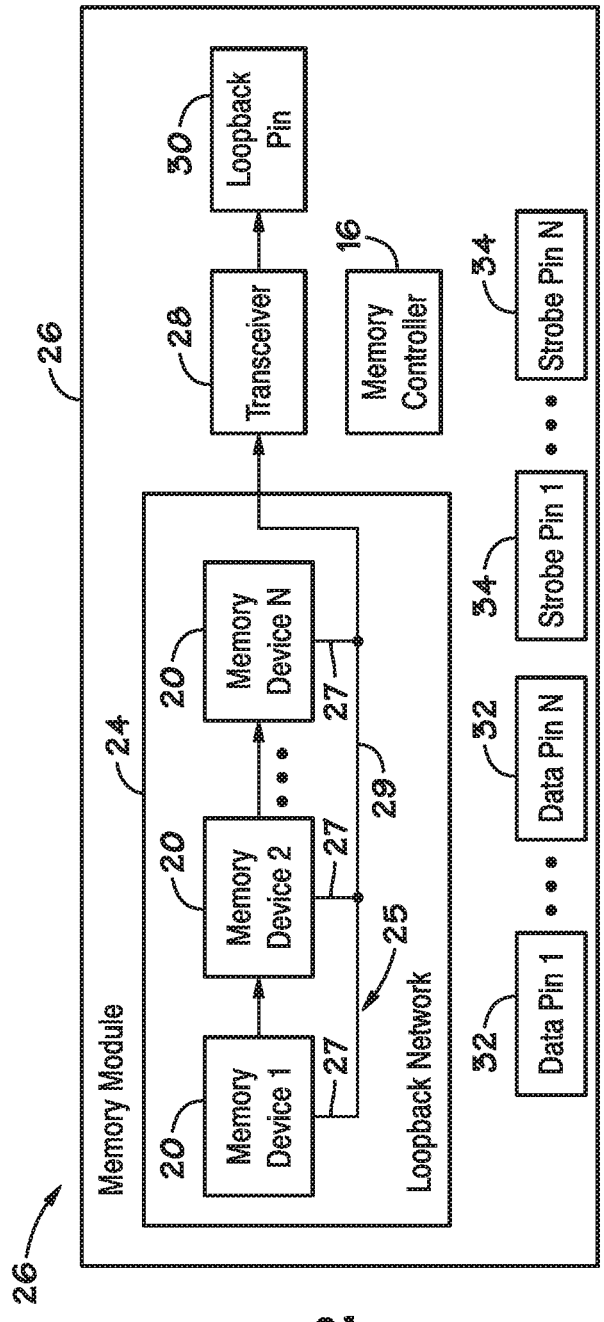
FIG. 2 is a block diagram of an example of a memory module implemented with the memory devices of FIG. 1 coupled in one or more loopback networks, in accordance with an embodiment.

To help illustrate, an example of a memory module 26, which includes multiple memory devices 20 coupled in a loopback network 24, a transceiver 28, a loopback pin 30, one or more data pins 32, and one or more strobe signal pins 34, is shown in FIG. 2. It should be appreciated that the depicted memory module 26 is merely intended to be illustrative not limiting. For example, in some embodiments, the memory module 26 may include multiple (e.g., two) loopback networks 24 each communicatively coupled to the transceiver 28.

The memory module 26 may provide external access to its memory devices 20 via the data pins 32 and the strobe signal pins 34, for example, while one or more of its memory devices 20 operate in a normal mode. In other words, while operating in the normal mode, the memory controller 16 may instruct the memory module 26 to output data signals based on data stored in the memory devices 20 via the data pins 32. Additionally, while operating in the normal mode, the memory controller 16 may instruct the memory module 26 to output strobe signals used to read the data signals via the strobe signal pins 34.

Furthermore, the memory module 26 may provide external access to its memory device 20 via the loopback pin 30, for example, while one or more of its memory devices 20 operate in a loopback mode. In some embodiments, a memory device 20 may operate in both the loopback mode and the normal mode simultaneously. In any case, while operating in the loopback mode, the loopback network 24 may output a loopback signal indicative of operation of a targeted memory device 20 to the transceiver 28 via a loopback datapath 25. In this manner, the transceiver 28 may control output timing of the loopback signal, for example, to coordinate output of loopback signals received from multiple loopback networks 24 implemented on the memory module 26.

In some embodiments, during a loopback operation, any of memory devices 20 connected in the loopback network 24 may be targeted for operational monitoring. For example, during a first loopback operation, a first memory device 20 in the loopback network 24 may be targeted for operational monitoring while a second memory device 20 in the loopback network 24 is targeted during a second (e.g., subsequent) loopback operation. To facilitate adjusting targeted memory device 20, in some embodiments, each loopback operation may be performed based at least in part on corresponding loopback parameters, for example, indicative of a memory device 20 and a loopback signal targeted for operational monitoring.

To facilitate monitoring operation of a target memory device 20, the target memory device 20 and other memory devices 20 (e.g., one or more memory devices 20 that are not the target memory device 20) may operate in a loopback mode during loopback operations. In particular, the target memory device 20 may operate in a retrieval sub-mode such that the target memory device 20 generates a target loopback signal. Additionally, the other memory devices 20 may each operate in a bypass sub-mode such that it does not operate to alter the target loopback signal, for example, by outputting an additional loopback signal or by interrupting transmission of the target loopback signal. The memory controller 16 may activate (e.g., enable) the retrieval sub-mode and the bypass sub-mode in the memory devices 20 to permit a memory device 20 to transmit a loopback signal through the loopback datapath without interruption from other memory devices 20.

Figure 3:
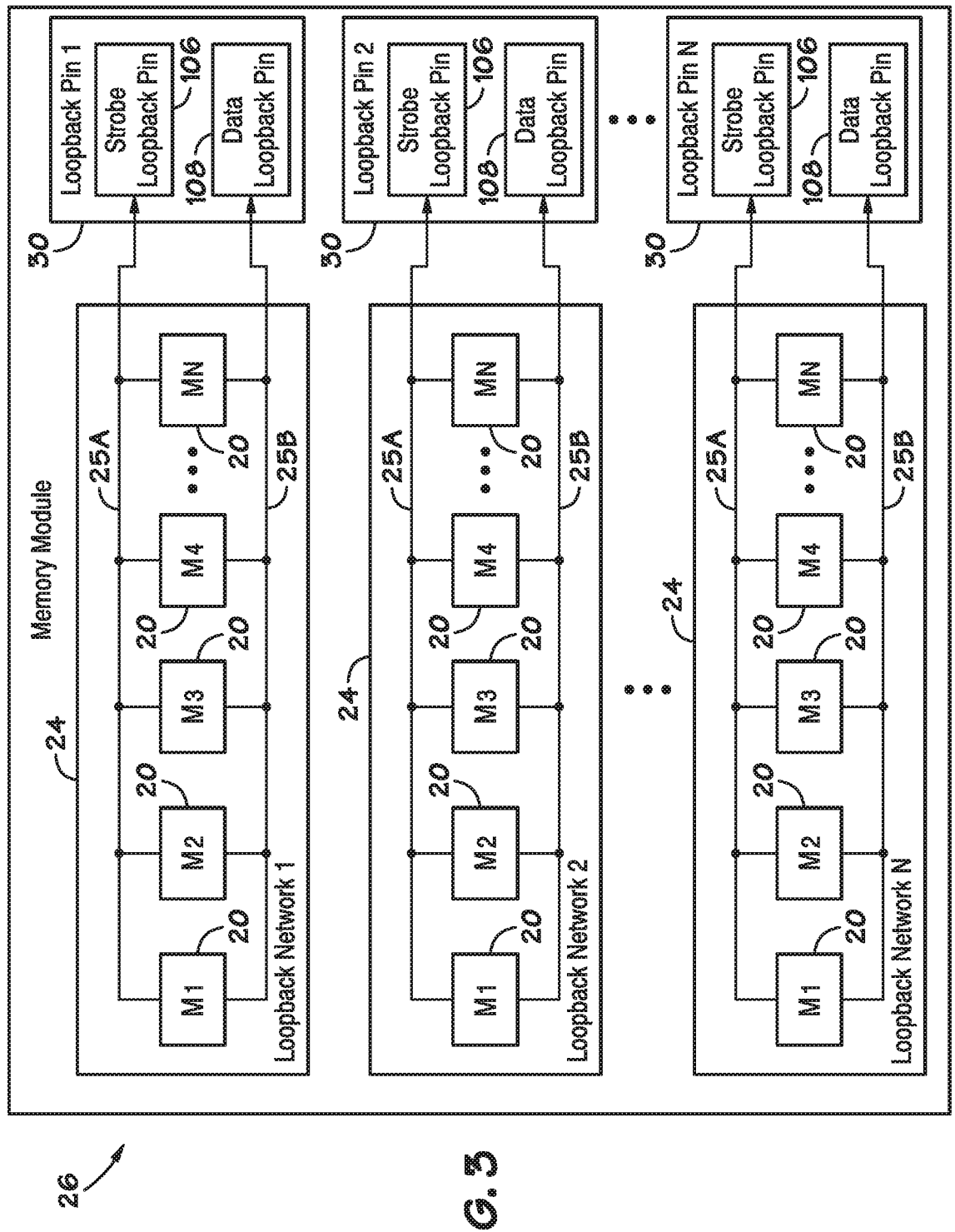
FIG. 3 is a block diagram of another example of a memory module implemented with the memory devices of FIG. 1 coupled in multiple loopback networks, in accordance with an embodiment.

As described above, a memory module 26 may include multiple loopback networks 24. To help illustrate, an example of a memory module 26 that includes multiple loopback networks 24 is shown in FIG. 3. As depicted, the memory module 26 includes multiple memory devices 20 coupled to each of the multiple loopback network 24. Additionally, as depicted, each of the multiple loopback network 24 is coupled to a corresponding one or more loopback pins 30.

In some embodiments, a loopback network 24 may output two types of loopback signals—a loopback data signal and/or a loopback strobe signal—to a corresponding loopback pin 30. The loopback data signal may be indicative of the target memory device 20 data operation and, thus, may be analyzed to monitor (e.g., debug and/or perform diagnostics on) data operation of the target memory device 20. Additionally, the loopback strobe signal may be indicative of the target memory device 20 strobe operation (e.g., clocking of data operation) and, thus, may be analyzed to monitor (e.g., debug and/or perform diagnostics on) strobe operation of the target memory device 20.

In some embodiments, the memory controller 16 may instruct the loopback networks 24 to output one or both of the loopback signals via respective loopback datapaths 25 to pins included in the loopback pin 30. For example, to facilitate monitoring strobe operation, the memory controller 16 may instruct a loopback network 24 to transmit a loopback strobe signal from a target memory device 20 through a strobe loopback datapath 25A to a strobe loopback pin 106. Additionally or alternatively, to facilitate monitoring data operation, the memory controller 16 may instruct the loopback network 24 to transmit a loopback data signal from the target memory device 20 through a data loopback datapath 25B to a data loopback pin 108. In some instances, a loopback data signal may be used to analyze system and/or device performance by checking a bit error rate and/or extracting jitter components from calculations and/or processing of the loopback data signal to verify operation characteristics of a targeted memory device 20.

It should be appreciated that the depicted embodiment is merely intended to be illustrative and not limiting. For example, although the depicted embodiment includes both a data loopback datapath 25B and a strobe loopback datapath 25A in each loopback network 24, in some embodiments, a loopback network 24 may include a single loopback datapath 25. In such embodiments, the loopback datapath 25 may be used to transmit loopback data signals, loopback strobe signals, or both, for example, by multiplexing the loopback signals.

Additionally, although shown on the same side of the memory module 26, the loopback networks 24 may implemented on different physical sides of the memory module 26. In FIG. 3, all the loopback networks 24 are shown on one (e.g., first) side. In some embodiments, a subset of the loopback networks 24 may be implemented on an opposite (e.g., second) of the memory module 26, which, at least in some instances, may facilitate increasing total number of loopback networks 24 that may physically fit on the memory module 26. For example, a first loopback network 24 may include twenty memory devices 20 coupled on a front side of the memory module 26 while a second loopback network 24 includes twenty memory devices 20 coupled on a back side of the memory module 26.

Furthermore, in some embodiments, external connectors may be coupled to the memory module 26 at the loopback pin 30. These external connectors may be detachable from the memory module 26 to improve production flexibility and/or reduce implementation associated costs, such as component count and/or manufacturing steps. In such embodiments, an external connector may be attached to the memory module 26 when performance characterization of one or more memory devices 20 is desired. For example, a first external connector may be connected to the memory module 26 via a loopback pin 30 while a second external connector is disconnected from the memory module 26. Moreover, in some embodiments, an external connector may extend perpendicularly from a (e.g., front) surface of the memory module 26 or parallel to the surface of the memory module 26, for example, along an edge of the memory module 26.

Specific implementation of a loopback network 24 may vary between different memory modules 26. For example, a memory module 26 may be implemented with a different number of external connectors, different memory device 20 connectivity, and/or different loopback datapath lengths. In fact, in some embodiments, implementation of a loopback network 24 on a memory module 26 may be determined based on a balancing of various factors, for example, by a manufacturer via a design (e.g., computing) device. In some embodiments, the factors may include space available to implement external connectors, target loopback signal integrity, target performance characterization accuracy, target memory module 26 size (e.g., footprint), and/or the like.

In some instances, signal integrity of a loopback signal may be dependent on a length of the loopback datapath 25. For example, reducing length of a loopback datapath 25 may reduce magnitude and/or likelihood of noise introduced on a loopback signal, thereby improving signal integrity and, thus, performance characterization accuracy. In fact, in some embodiments, length may be reduced by connecting a loopback datapath 25 alternatingly to memory devices 20 on the front side of memory module 26 and memory devices 20 on the back side of the memory module 26.

Additionally, loopback signal integrity may be dependent on type of components through which the loopback signal is transmitted. To facilitate reducing introduced noise, in some embodiments, a loopback datapath 25 may be implemented as a multi-drop signal carrier. For example, with reference to FIG. 2, the loopback datapath 25 includes a trunk (e.g., central) connector 29 and multiple branch connectors 27, which each connects a corresponding memory device 20 to the trunk connector 29.

In such embodiments, although connected to multiple memory devices 20, the loopback datapath 25 may enable a loopback signal output from a target memory device 20 to be routed to an external connector (e.g., via a corresponding loopback pin 30) without passing through other memory devices 20. Since routing electrical signals through memory devices 20 may introduce noise, implementing a loopback datapath 25 in this manner may introduce less noise, for example, compared to routing the loopback signal through one or more other memory devices 20. In other words, at least in some instances, implementing the loopback datapath 25 in this manner may facilitate improving integrity of loopback signals and, thus, performance characterization accuracy based on the loopback signals.

To understand better the loopback signal and the memory device 20, an example memory device 20, which may be implemented in a loopback network 24, is shown in FIG. 3. As depicted, the memory device 20 includes storage circuitry 36 and an output buffer 46. In some embodiments, the storage circuitry 36 may function to store data in the memory device 20. In other words, the storage circuitry 36 may include an array of memory cells that stores data, which may be output to an external device (e.g., processor 12) and, thus, used to generate loopback signals indicative of operation of the memory device 20.

While operating in the loopback mode, a memory device 20 in a loopback network 24 may be targeted for operational monitoring of data signals and/or strobe signals associated with the memory device 20. In some embodiments, the memory controller 16 may instruct the target memory device 20 to enter a retrieval sub-mode to generate a target loopback data signal and/or a target loopback strobe signal.

In some embodiments, a target loopback data signal may originate from targeted data stored in the targeted memory device 20. To access the target data, a target memory device 20 may operate in a retrieval sub-mode of the loopback mode, for example, as instructed by the memory controller 16 via one or more control signals 48 and/or values indicated in the mode registers 18. In the retrieval sub-mode, the target memory device 20 may generate a loopback data signal indicative of the target data (e.g., by sampling, sub-sampling, or modifying a corresponding data signal) for output via the output buffer 46. In some embodiments, the output buffer 46 may output the loopback data signal to a data loopback datapath 25B, for example, via a corresponding branch connector 27, thereby enabling the loopback data signal to be output from the memory module 26 via a corresponding data loopback pin 108.

Additionally or alternatively, a target loopback strobe signal may originate from a targeted strobe signal used by the targeted memory device 20, for example, to read data stored in the memory device 20. To access the target strobe signal, a target memory device 20 may operate in a retrieval sub-mode of the loopback mode, for example, as instructed by the memory controller 16 via one or more control signals 48 and/or values indicated in the mode registers 18. While in the retrieval sub-mode, the target memory device 20 may generate a loopback strobe signal indicative of the target strobe signal (e.g., by sampling, sub-sampling, or modifying a corresponding strobe signal of the target memory device 20) for output by the output buffer 46. In some embodiments, the output buffer 46 may output the loopback strobe signal to a strobe loopback datapath 25A, for example, via a corresponding branch connector 27, thereby enabling the loopback strobe signal to be output from the memory module 26 via a corresponding strobe loopback pin 106.

Additionally, in some embodiments, memory devices 20 in the loopback network 24 other than the target memory device 20 may operate in a bypass sub-mode of the loopback mode, for example, as instructed by the memory controller 16 via one or more control signals 48 and/or values indicated in the mode registers 18. While operating in the bypass sub-mode, a memory device 20 may be blocked from outputting signals including other loopback signals to facilitate improving signal integrity of a targeted loopback signal, for example, by reducing noise and/or likelihood of the transmission of the loopback signal being interrupted.

In other words, each memory device 20 may be instructed to selectively operate in the bypass sub-mode or the retrieval sub-mode. As described above, when operating in a bypass sub-mode, a memory device 20 may be blocked from outputting signals to the loopback datapath 25. On the other hand, when operating in a retrieval sub-mode, a memory device 20 may output a loopback signal 49 indicative of target data communicated with its storage circuitry 36 and/or indicative of a target strobe signal associated with data communicated with its storage circuitry 36. Thus, in some embodiments, the output buffer 46 may transmit an output loopback signal 49 based at least in part on an operational sub-mode of a corresponding memory device 20. For example, the output buffer 46 may transmit the output loopback signal 49 when the corresponding memory device 20 is in the retrieval sub-mode and may not transmit the output loopback signal 49 when the corresponding memory device 20 is in a bypass sub-mode.

In this manner, a target loopback signal generated based at least in part on a loopback signal originating in the loopback network 24 may be output, for example, by the transceiver 28 via a loopback pin 30. As described above, a target loopback signal may be indicative of memory device 20 operation and, thus, may be analyzed to monitor (e.g., debug or perform diagnostics) operation of a target memory device 20, for example, by a host controller. In other words, operation of one or more memory devices 20 in a loopback network 24 may be controlled to facilitate monitoring operation of a target memory device 20.

Figure 5:
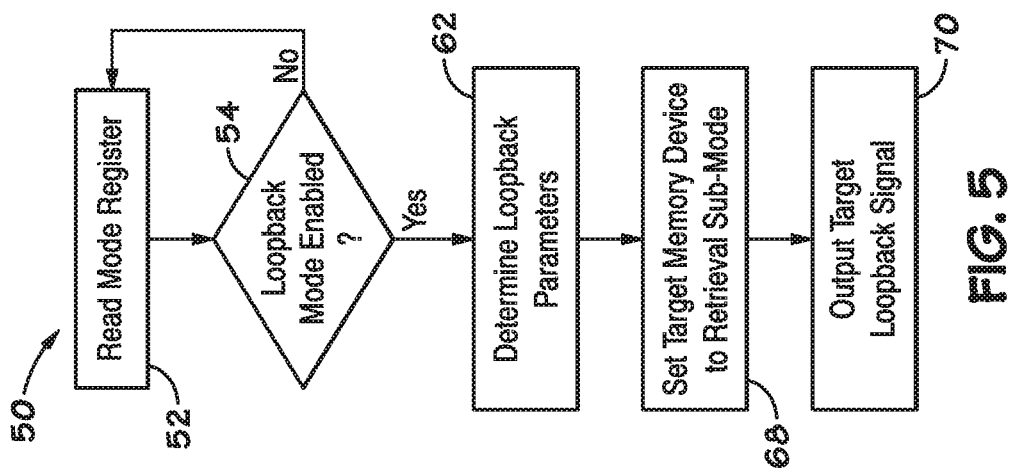
FIG. 5 is a flow diagram of a process for controlling operation of the memory device of FIG. 4 to output a loopback signal, in accordance with an embodiment.
Figure 4:
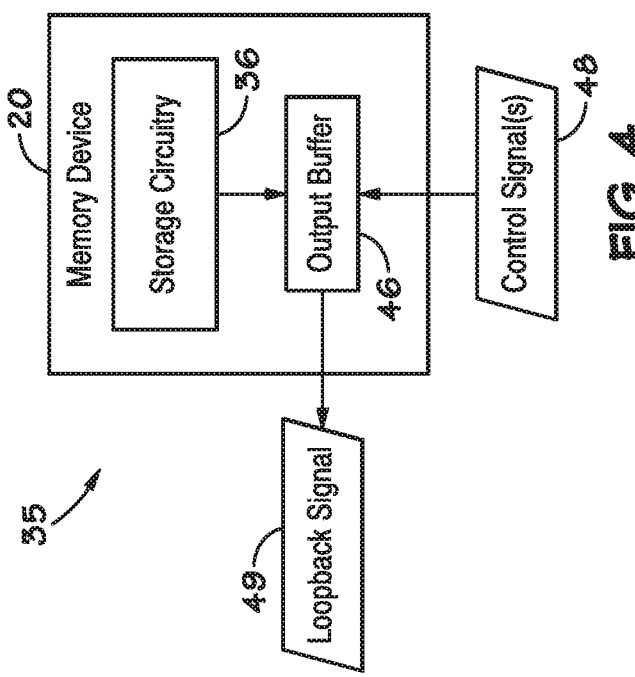
FIG. 4 is a block diagram of a memory device of FIG. 1, in accordance with an embodiment.

To help illustrate, an example of a process 50 for controlling operation of memory devices 20 coupled in a loopback network 24 is described in FIG. 5. Generally, the process 50 includes a reading mode register (process block 52), determining whether a loopback mode is enabled (decision block 54). When the loopback mode is enabled, the process 50 includes determining loopback parameters (process block 62), setting a target memory device to a retrieval sub-mode (process block 68), and generating a target loopback signal (process block 70). In some embodiments, the process 50 may be implemented at least in part by executing instructions stored in a tangible, non-transitory, computer-readable medium, such as one or more memory devices 20, using processing circuitry, such as the processor 12 and/or the memory controller 16. Additionally or alternatively, the process 50 may be implemented at least in part based on circuit connections formed in processing circuitry, such as the memory controller 16.

Thus, in some embodiments, the memory controller 16 may read the mode registers 18 (process block 52). In some embodiments, the mode registers 18 may indicate an operational mode of each memory device 20 implemented on a memory module 26. For example, a mode register 18 may indicate a first value when a memory device 20 is to be operated in a normal mode and a second value when the memory device 20 is to be operated in a loopback mode. Additionally or alternatively, a mode register 18 may indicate a third value when the memory device 20 is to be operated in a retrieval sub-mode and a fourth value when the memory device 20 is to be operated in a bypass sub-mode. Thus, based at least in part on the mode registers 18, the memory controller 16 may determine an operational mode and continue checking the mode registers 18 until the loopback mode is enabled (decision block 54).

Figure 6:
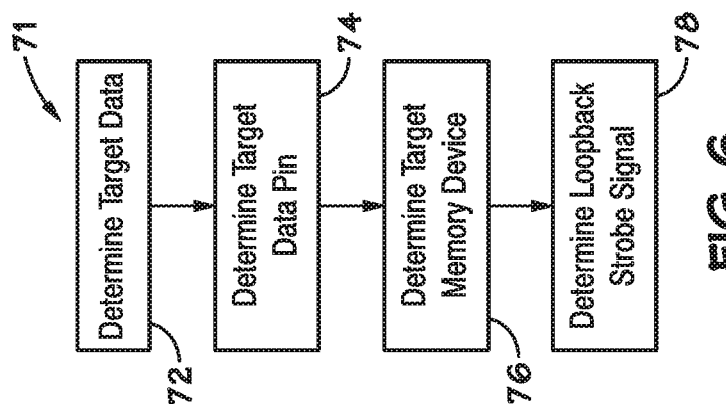
FIG. 6 is a flow diagram of a process for determining loopback parameters, in accordance with an embodiment.

After the loopback mode is enabled, the memory controller 16 may determine loopback parameters to be implemented in the loopback network 24 (process block 62). To help illustrate, an example of a process 71 for determining loopback parameters is described in FIG. 6. Generally, the process 71 includes determining target data (process block 72), determining a target data pin (process block 74), determining a target memory device (process block 76), and determining a loopback strobe signal (process block 78). In some embodiments, the process 71 may be implemented by executing instructions stored in a tangible, non-transitory, computer-readable medium, such as one or more memory devices 20, using processing circuitry, such as the processor 12 and/or the memory controller 16.

Thus, in some embodiments, the memory controller 16 may determine target data (process block 72). As described above, target data may be indicative of operation of a memory device 20. Additionally, as described above, operation of a memory device 20 may be monitored by a host controller, for example, implemented in a processor 12. Thus, in some embodiments, the memory controller 16 may receive an indication of data targeted to facilitate operational monitoring from the host controller. The indication of data targeted may specify whether the loopback network 24 is to output a loopback data signal, a loopback strobe signal, or both.

Based at least in part on the target data, the memory controller 16 may determine a target data pin 32 on a memory module 26 (process block 74). As described above, data signals may be communicated with a memory device 20 via data signals on a corresponding data pin 32. Thus, in some embodiments, the memory controller 16 may determine the target data pin 32 based at least in part on which data pin 32 on the memory module 26 is used to communicate a data signal corresponding with the target data. Additionally or alternatively, the memory controller 16 may receive an indication of the target data pin 32 from the host controller.

Furthermore, the memory controller 16 may determine a memory device 20 on the memory module 26 targeted for operational monitoring (process block 76). In some embodiments, the memory controller 16 may determine the target memory device 20 based at least in part on the target data and/or the target data pin 32. For example, the memory controller 16 may determine the target memory device 20 based at least in part on which memory device 20 on the memory module 26 utilizes the target data pin 32 and/or which memory device 20 on the memory module 26 communicates (e.g., receives, stores, or outputs) the target data. Additionally or alternatively, the memory controller 16 may receive an indication of the target memory device 20 from the host controller.

In addition, the memory controller 16 may determine a loopback strobe signal (process block 78). The loopback strobe signal may facilitate reading the target loopback signal outputted via the loopback pin 30. In some embodiments, the loopback strobe signal may be determined based at least in part on a strobe signal used to read a data signal corresponding with the target data. Additionally, in some embodiments, the loopback strobe signal may be determined based at least in part on a sampling rate used to determine the loopback signal from the corresponding data signal.

Returning to the process 50 of FIG. 5, based at least in part on the loopback parameters, the memory controller 16 may determine the target memory device 20 and instruct the target memory device 20 in the loopback network 24 to operate in a retrieval sub-mode, for example, via one or more control signals 48 (process block 68). Additionally, based at least in part on the loopback parameters, the memory controller 16 may instruct the target memory device 20 to generate a target loopback signal (process block 70). As described above, in some embodiments, the memory controller 16 may instruct one or more other memory devices 20 in the loopback network 24 to operate in a bypass sub-mode, for example, via one or more control signals 48 to reduce likelihood of the one or more other memory devices 20 affecting signal integrity of the target loopback signal.

Additionally, in some embodiments, the target memory device 20 may generate the target loopback signal based on a data signal and/or a strobe signal, for example, used to read the data signal. For example, the target memory device 20 may generate a loopback data signal with a lower frequency that a corresponding data signal, for example, by sampling every fourth bit of the data signal using a loopback strobe signal that has one fourth the frequency of a corresponding strobe signal.

Figure 7:
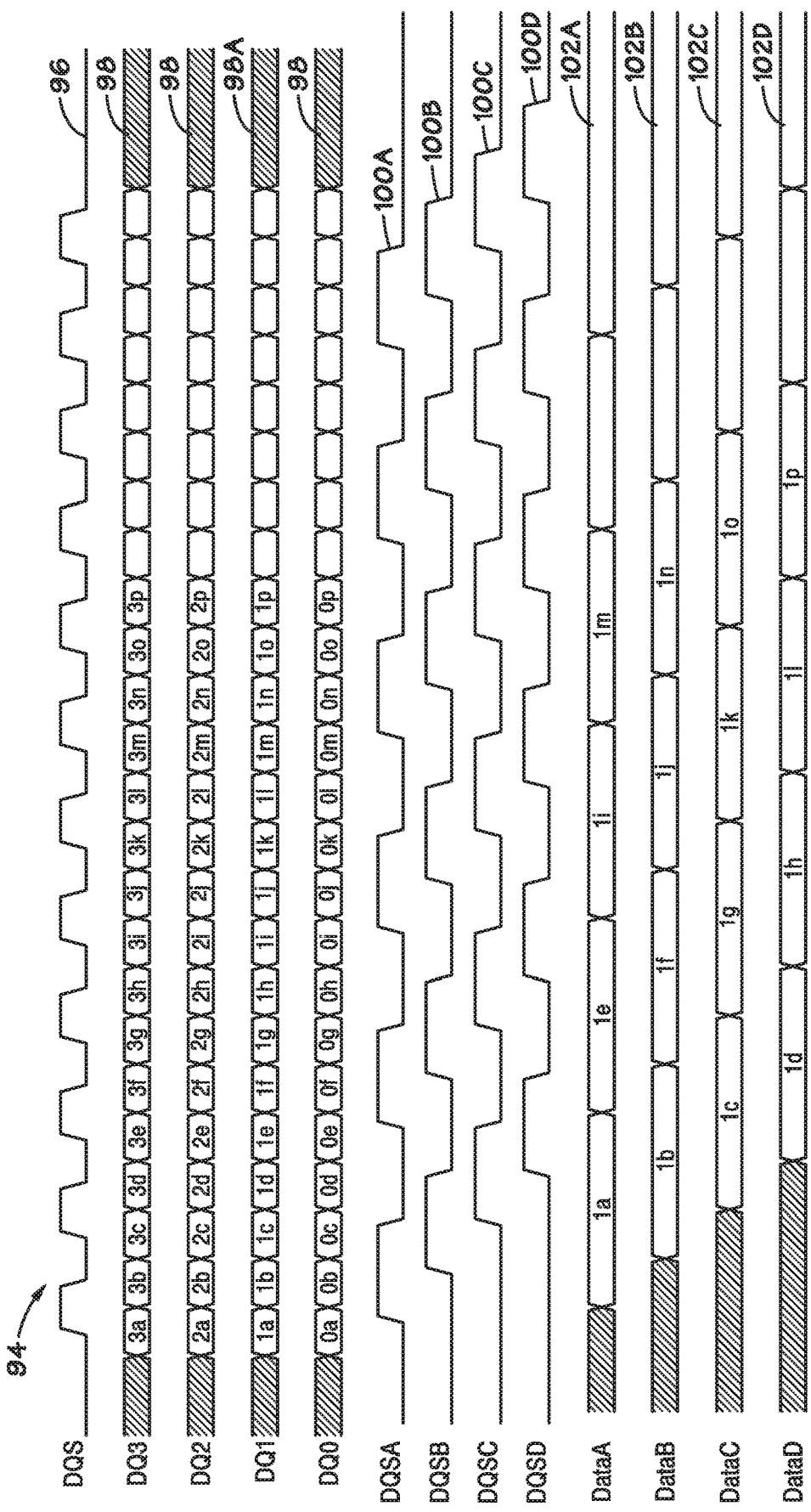
FIG. 7 is a timing diagram of a strobe signal, data signals, loopback data signals, and loopback strobe signals in the memory device of FIG. 4, in accordance with an embodiment.

To help illustrate, a timing diagram 94, which includes signal waveforms present in the memory system 14 (e.g., signal waveforms of a target memory device 20), is shown in FIG. 7. As depicted, the timing diagram 94 describes a strobe signal 96, data signals 98, loopback strobe signals 100, and loopback data signals 102. As described above, in some embodiments, a target loopback signal (e.g., loopback data signal 102 and/or loopback strobe signal 100) may be generated and outputs from the target memory device 20.

In some embodiments, the target memory device 20 may generate one or more loopback data signals 102 based at least in part on a corresponding data signal 98, for example, by down sampling and/or phase shifting the data signal 98. To help illustrate, in the depicted example, each data signal 98 includes a series (e.g., stream) of data aligned with the strobe signal 96, for example, such that odd order data in the series are center aligned with rising edges of the strobe signal 96 and even order data in the series are center aligned with falling edges of the strobe signal 96. As described above, in some embodiments, frequency of the data signals 98 may be high to facilitate improving data transfer speed provided by memory.

To facilitate monitoring operation, in some embodiments, the target memory device 20 may down sample a data signal 98 to generate one or more loopback data signals 102 with lower frequency. To help illustrate, in the depicted example, the target memory device 20 down samples the data signal 98 by a factor of four to generate corresponding loopback data signals 102. For example, when a first data signal 98A is targeted, the target memory device 20 may generate a first loopback data signal 102A, a second loopback data signal 102B, a third loopback data signal 102C, and/or a fourth loopback data signal 102D that each has one fourth the frequency of the first data signal 98A. In other embodiments, the target memory device 20 may generate loopback data signals 102 by down sampling the data signal 98 by a different factor (e.g., two) or up sampling the data signal 98. Additionally or alternatively, the target memory device 20 may generate loopback data signals 102 with the same frequency as a corresponding data signal 98.

In some embodiments, since a corresponding data signal 98 sequentially indicates data, one or more of the loopback data signals 102 generated based on the data signal 98 may be phase shifted (e.g., delayed) relative to the data signal 98 and/or relatively to one another. To help illustrate, in the depicted example, the first loopback data signal 102A, the second loopback data signal 102B, the third loopback data signal 102C, and the fourth loopback data signal 102D is each delayed approximately one quarter of the period of the strobe signal 96 relative to corresponding data in the first data signal 98A. Additionally, in the depicted example, the second loopback data signal 102B is delayed approximately one quarter of the period of the strobe signal 96 relative to the first loopback data signal 102A, the third loopback data signal 102C is delayed approximately one quarter of the period of the strobe signal 96 relative to the second loopback data signal 102B, and the fourth loopback data signal 102D is delayed approximately one quarter of the period of the strobe signal 96 relative to the third loopback data signal 102C.

Additionally or alternatively, the target memory device 20 may generate one or more loopback strobe signals 100 based at least in part on the strobe signal 96, for example, by down sampling and/or phase shifting the strobe signal 96 to facilitate reading a corresponding loopback data signal 102. In some embodiments, the target memory device 20 may generate a loopback strobe signal 100 such that an (e.g., falling) edge is center aligned with data indicated by a corresponding loopback data signal 102. To help illustrate, in the depicted example, the target memory device 20 down samples the strobe signal 96 by a factor of two to generate a first loopback strobe signal 100A corresponding with the first loopback data signal 102A, a second loopback strobe signal 100B corresponding with the second loopback data signal 102B, a third loopback strobe signal 100C corresponding with the third loopback data signal 102C, and/or a fourth loopback strobe signal 100D corresponding with the fourth loopback data signal 102D.

In some embodiments, the strobe signal 96 may be generated based on component (e.g., positive and negative) strobe signals. For example, the strobe signal 96 may be generated based on difference between a positive strobe signal and a negative strobe signal. In such embodiments, the positive strobe signal may be used as the first loopback strobe signal 100A and the negative strobe signal may be used as the second loopback strobe signal 100B. In any case, in the depicted example, the second loopback strobe signal 100B is delayed approximately one half the period of the strobe signal 96 (e.g., one quarter the period of the loopback strobe signals 100) relative to the first loopback strobe signal 100A, the third loopback strobe signal 100C is delayed approximately one half the period of the strobe signal 96 relative to the second loopback strobe signal 100B, and the fourth loopback strobe signal 100D is delayed approximately one half the period of the strobe signal 96 relative to the third loopback strobe signal 100C.

In this manner, a memory device 20 targeted for operational monitoring may generate one or more target loopback signals based at least in part on the loopback parameters. As described above, upon being set to the retrieval sub-mode, the target memory device 20 may output the one or more target loopback signals to a loopback data path 25, thereby enabling the one or more target loopback signals to be output via a corresponding loopback pin 30. Additionally, as described above, a host controller (e.g., processor 12) may receive the one or more target loopback signals via an external connector (e.g., a coaxial cable, a transmission line) coupled to the loopback pin 30 and perform operational monitoring (e.g., diagnostics) on the target memory device 20 based at least in part on the received target loopback signals.

However, as described above, accuracy of the operational monitoring may be dependent on signal integrity of the received target loopback signals. In some embodiments, signal integrity of a loopback signal 49 may be dependent on length of the loopback datapath 25 through which the loopback signal 49 is transmitted. In some embodiments, implementing a loopback datapath 25 as a multi-drop one pin signal carrier (e.g., multi-drop because multiple memory devices 20 may be coupled to the loopback pin 30 through the loopback datapath) may result in varying loopback datapath length between the host controller and different memory devices 20. For example, with reference to the memory module 26 shown in FIG. 2, assuming that length of each branch connector 27 in the loopback datapath 25 is approximately the same, a loopback signal 49 output from a last memory device 20 (e.g., $M_1$) may be transmitted through more of the loopback datapath 25 (e.g., over a longer signal carrier length compared a loopback signal 49 output from another memory device 20 (e.g., $M_2$ or $M_N$). As such, signal integrity of loopback signals 49 output from different memory devices 20 in a loopback network 24 may vary.

Figure 8A:
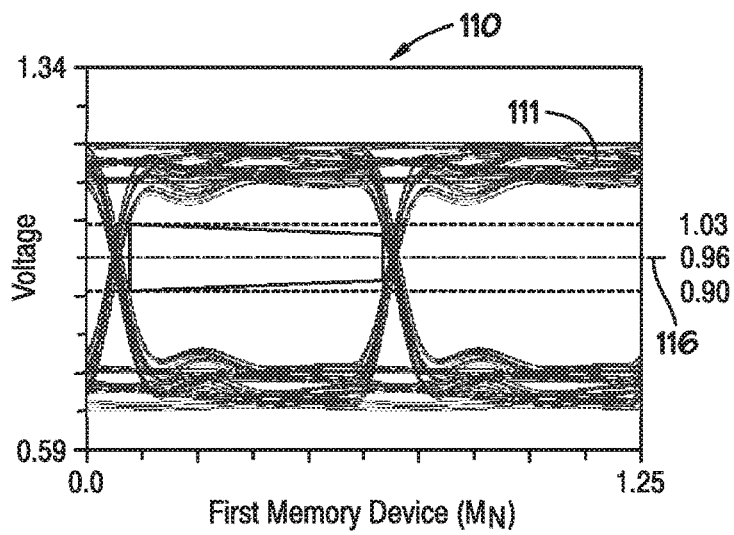
FIG. 8A is an eye diagram of output loopback signals originating from a closest memory device in a loopback network, in accordance with an embodiment.
Figure 8B:
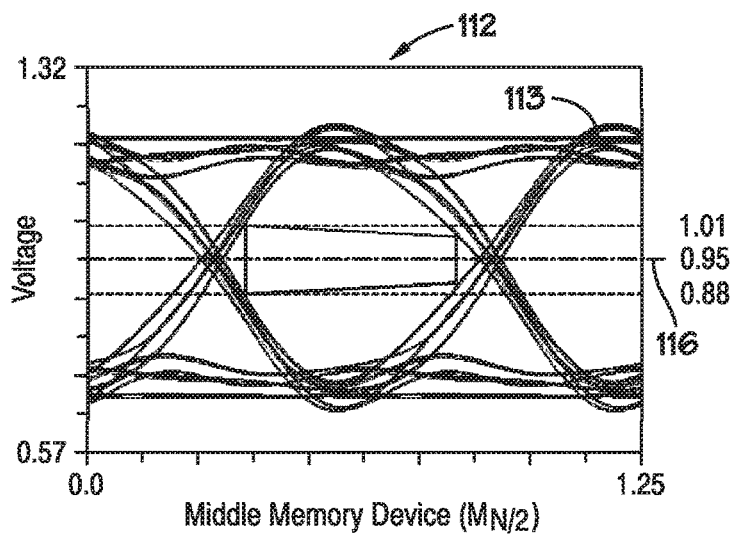
FIG. 8B is an eye diagram of output loopback signals originating from a middle memory device in the loopback network, in accordance with an embodiment.
Figure 8C:
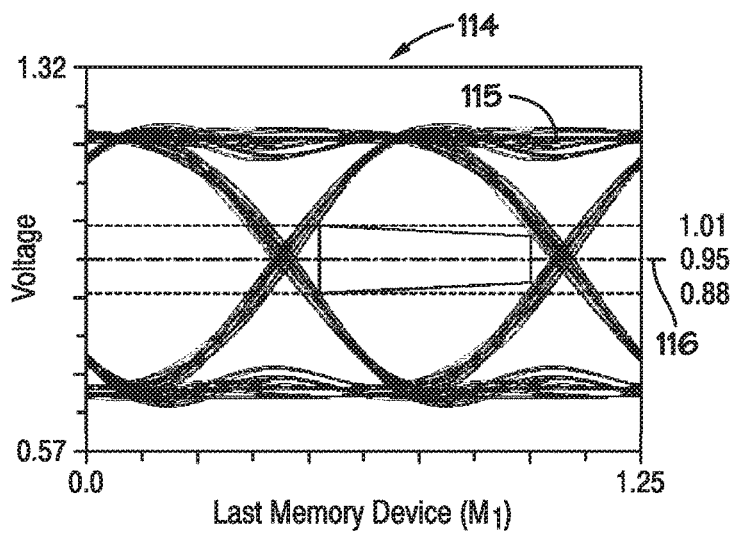
FIG. 8C is an eye diagram of output loopback signals originating from a furthest memory device in the loopback network, in accordance with an embodiment.

To help illustrate, a first eye diagram 110, which describes voltage of first loopback signals 111 output from a first (e.g., closet) memory device 20 ($M_N$), is shown in FIG. 8A, a second eye diagram 112, which describes voltage of second loopback signals 113 output from a second (e.g., middle) memory device 20 ($M_{N/2}$), is shown in FIG. 8B, and a third eye diagram 114, which describes voltage of third loopback signals 115 output from a third (e.g., furthest or last) memory device 20 ($M_1$), is shown in FIG. 8C. In particular, each of the eye diagrams indicates voltage of corresponding loopback signals 49 over a duration from 0 to 1.25 ns.

With regard to the depicted eye diagrams, a host may interpret (e.g., read) a received loopback signal (e.g., the first loopback signals 111, the second loopback signals 113 or, the third loopback signals 115) based on a threshold voltage level 116 (e.g., approximately 0.95 volts). For example, when voltage of the received loopback signal 49 is greater than the threshold voltage level 116, the host controller may read a "1" bit and, when voltage of the received loopback signal 49 is less than the threshold voltage level 116, the host controller may read a "0" bit. In some instances, likelihood of misreading a bit may increase as margin between the received loopback signal and the threshold voltage level 116 decreases. Although the voltage waveform of the first loopback signal 111, the second loopback signal 113, and the third loopback signal 115 differ, all three are expected to provide sufficient margin from the threshold voltage level 116. As such, signal integrity differences due to differing signal carrier length of the loopback datapath are not expected to substantially affect performance characterization accuracy.

Figure 9:
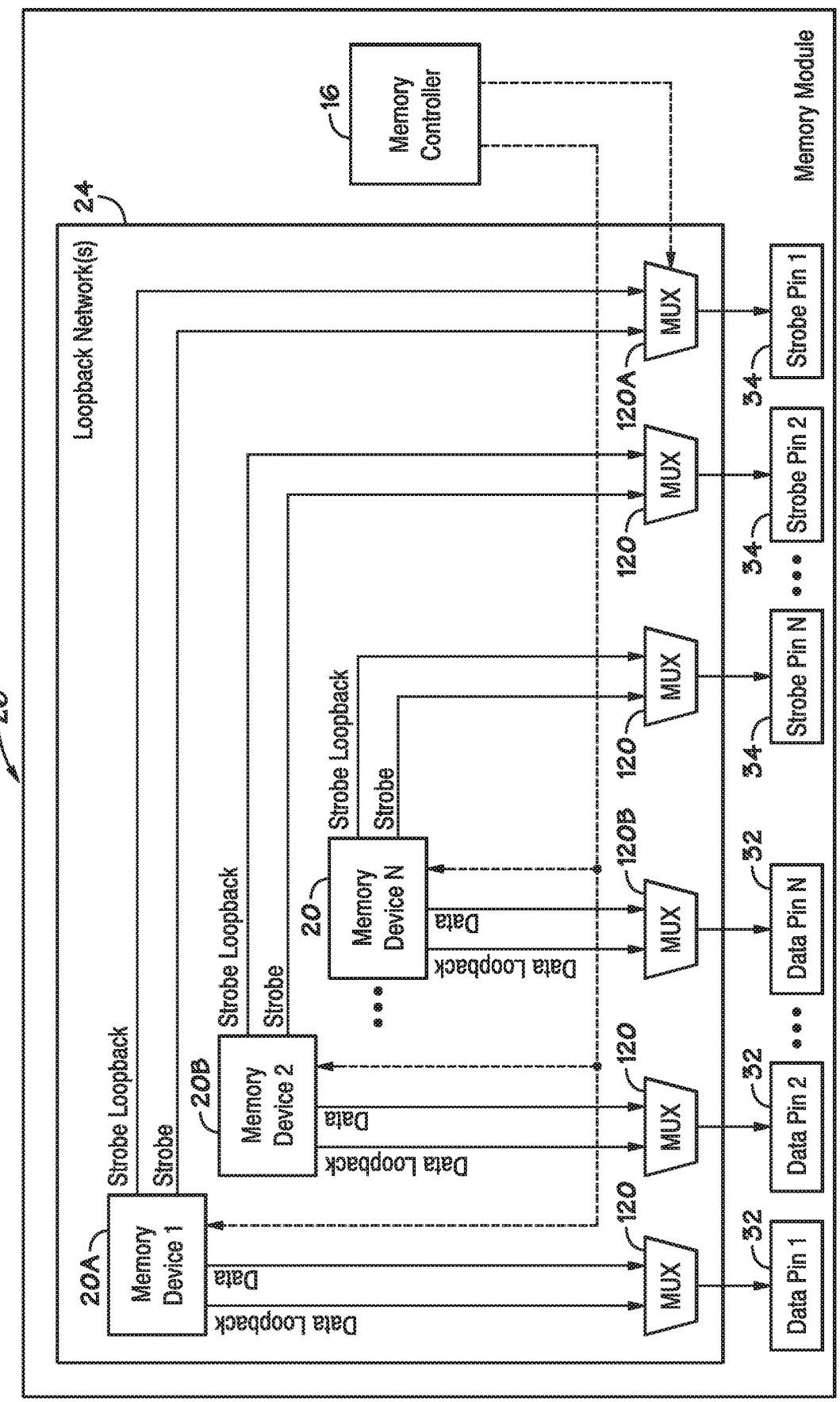
FIG. 9 is a block diagram of another embodiment of a memory module implemented with the memory devices of FIG. 1 coupled in one or more loopback networks, in accordance with an embodiment.

With the foregoing in mind, another example of a memory module 26 is shown in FIG. 9. As depicted, the memory module 26 includes multiplexers 120 coupled between its memory devices 20 and its external pins (e.g., data pins 32 and strobe pins 34). As described above, a memory controller 16 may generally control operation of the memory devices 20, for example, by instruct a memory device 20 to operate in a normal mode or a loopback mode. Additionally, in the depicted embodiment, the memory controller 16 may control operation of one or more multiplexers 120, for example, via one or more control signals that instruct a strobe multiplexer 120A to selectively supply either a strobe signal 96 or a target loopback strobe signal 100 to a corresponding strobe pin 34 and/or that instruct a data multiplexer 120B to selectively supply either a data signal 98 or a target loopback data signal 102 to a corresponding data pin 32. In other words, in some embodiments, the memory controller 16 may control operation of the multiplexers 120 based at least in part on operational mode of corresponding memory devices 20.

In the depicted embodiment, each memory devices 20 in the loopback network 24 may be coupled to a corresponding data multiplexer 120B and/or a corresponding strobe multiplexer 120A. At least in some instances, implementing the loopback network 24 in this manner may enable multiple memory devices 20 in the loopback network 24 to be operated relatively independently, for example, such that multiple memory devices 20 are instructed to simultaneously output target loopback signals 49. For example, the memory controller 16 may instruct a first memory device 20 to output a first loopback strobe signal 49 while a second memory device 20 outputs a second loopback strobe signal 49. At least in some instances, this may facilitate reducing duration of performance monitoring and, thus, improving monitoring efficiency.

In other embodiments, multiple memory devices 20 in the loopback network 24 may be coupled to a single data multiplexer 120B and/or a single strobe multiplexer 120A. In such embodiments, the memory controller 16 may instruct a targeted memory device 20 to operate in a retrieval sub-mode and instruct the other memory devices 20 in the loopback network 24 operate in a bypass sub-mode. In any case, at least in some instances, implementing a loopback network 24 in this manner may facilitate reducing implementation associated cost of the memory module 26, for example, by obviating dedicated loopback pins 30.

Thus, technical effects of the present disclosure include facilitating improved monitoring of memory device operations, for example, by improving signal integrity of a loopback signal indicative of memory device operation. The techniques include a methods of decreasing a signal carrier length associated with a loopback datapath and describes possible embodiments to do so. The techniques also includes methods to enable direct access to monitor and/or verify performance of memory device without interrupting data transmission to and/or from storage circuitry of the memory device and describes possible embodiments to do so.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A memory module, comprising:
   a first external pin configured to enable coupling of the memory module and an external electronic device;
   a first loopback network coupled to the first external pin, wherein the first loopback network comprises a first loopback datapath;
   a first plurality of memory devices comprising:
      a first memory device coupled to the first loopback datapath, wherein the first memory device comprises first storage circuitry, and wherein the first storage circuitry is configured to store first data; and
      a second memory device coupled to first loopback datapath, wherein the second memory device comprises second storage circuitry, and wherein, when the first memory device is selected by a memory controller from the first plurality of memory devices for operational monitoring, the memory controller is configured to:
         configure the first memory device to output a first loopback data signal to the first loopback datapath, wherein the first loopback data signal is generated based at least in part on the first data; and
         configure the second memory device to disable output from the second memory device to the first loopback datapath while operated in a bypass sub-mode;
   a data pin coupled to the first memory device, wherein the data pin is configured to output a data signal indicative of the first data when the first memory device operates in a normal mode; and
   a strobe pin coupled to the first memory device, wherein the strobe pin is configured to output a strobe signal that facilitates reading the data signal output from the data pin when the first memory device operates in the normal mode, and wherein the first external pin is configured to output the first loopback data signal when the first memory device operates in a loopback mode to enable the external electronic device to monitor operation of the first memory device based at least in part on an analysis of the first loopback data signal.

2. The memory module of claim 1, wherein:

the first loopback network comprises a second loopback datapath; and when the first data is selected by the memory controller:
configure the first memory device to output a loopback strobe signal to the second loopback datapath, wherein the loopback strobe signal is generated based at least in part on the strobe signal; and
configure the second memory device to disable output from the second memory device to the second loopback datapath.

3. The memory module of claim 2, comprising a second external pin coupled to the second loopback datapath, wherein the second external pin is configured to output the loopback strobe signal when the first memory device operates in the loopback mode to enable the external electronic device to read the first loopback data signal based at least in part on the loopback strobe signal.

4. The memory module of claim 3, wherein the first memory device is configured to:
generate the first loopback data signal by down sampling the data signal, phase shifting the data signal, or both; and
generate the loopback strobe signal by down sampling the strobe signal, phase shifting the data signal, or both.

5. The memory module of claim 1, comprising a multiplexer coupled between the first memory device and the first external pin, wherein the multiplexer is configured to:
supply a data signal to the first external pin when the first memory device is operating in a normal mode; and
supply the first loopback data signal to the first external pin when the first memory device is operating in a loopback mode.

6. The memory module of claim 1, wherein the memory controller is configured to:
determine to not select any memory device of the first plurality of memory devices for the operational monitoring;
instruct each of the first plurality of memory devices to operate in a normal mode in response to determining to not select any memory device of the first plurality of memory devices for the operational monitoring; and
determine to select the first memory device for the operational monitoring; and
instruct each of the first plurality of memory devices, except for the first memory device, to operate in a loopback mode when in response to determining to select the first memory device for the operational monitoring.

7. The memory module of claim 6, wherein, to instruct each of the first plurality of memory devices to operate in the loopback mode, the memory controller is configured to:
instruct each of the first plurality of memory devices, except for the first memory device, to disable output from the first plurality of memory devices except from the first memory device to the first loopback datapath while operated in the bypass sub-mode.

8. The memory module of claim 1, comprising:
a second external pin configured to enable coupling the memory module and the external electronic device;
a second loopback network coupled to the second external pin, wherein the second loopback network comprises a second loopback datapath; and
a second plurality of memory devices comprising:
a third memory device coupled to the second loopback datapath, wherein the third memory device comprises third storage circuitry storing second data; and
a fourth memory device coupled to the second loopback datapath, wherein the fourth memory device comprises fourth storage circuitry;
wherein, when the third memory device is selected by the memory controller for the operational monitoring, the memory controller is configured to:
configure the third memory device to output a second loopback data signal generated based at least in part on the second data to the second loopback datapath; and
configure the second memory device disable output from the fourth memory device to the second loopback datapath.

9. The memory module of claim 1, wherein the first loopback datapath is alternatingly coupled to a first subset of memory devices of the first plurality of memory devices disposed on a first surface of the memory module and to a second subset of memory devices of the first plurality of memory devices disposed on a second surface of the memory module opposite the first surface.

10. The memory module of claim 1, wherein the first plurality of memory devices comprises a third memory device coupled to the first loopback datapath, and wherein the memory controller is configured to configure the third memory device to disable output from the third memory device to the first loopback datapath when the first memory device is selected by the memory controller for the operational monitoring.

11. The memory module of claim 1, wherein the memory module comprises a dual in-line memory module, and wherein each of the first plurality of memory devices comprises a dynamic random-access memory device.

12. A loopback network coupled to an external pin, comprising:
a first loopback datapath; and
a plurality of memory devices each coupled to the first loopback datapath, wherein the plurality of memory devices comprises:
a first memory device coupled to the first loopback datapath, wherein the first memory device comprises first storage circuitry, and wherein the first storage circuitry is configured to store first data, wherein the first memory device is coupled to a data pin configured to output a data signal indicative of the first data when the first memory device operates in a normal mode, and wherein the first memory device is coupled to a strobe pin configured to output a strobe signal that facilitates reading the data signal output from the data pin when the first memory device operates in the normal mode; and
a second memory device coupled to the first loopback datapath, wherein the second memory device comprises second storage circuitry;
wherein, when the first memory device is selected by a memory controller from the plurality of memory devices for operational monitoring, the memory controller is configured to:
configure the first memory device to output a first loopback data signal to the first loopback datapath, wherein the first loopback data signal is generated based at least in part on the first data, wherein the external pin is configured to output the first loopback data signal to enable monitoring of operation of the first memory device based at least in part on an analysis of the first loopback data signal; and configure the second memory device to disable output from the second memory device to the first loopback datapath while operated in a bypass sub-mode.

13. The loopback network of claim 12, comprising a second loopback datapath, wherein when the first data is selected by the memory controller, the memory controller is configured to:
configure the first memory device to output a loopback strobe signal to the second loopback datapath, wherein the loopback strobe signal is generated based at least in part on a strobe signal of the first memory device; and
configure the second memory device disable output from the second memory device to the second loopback datapath.

14. The loopback network of claim 12, wherein the memory controller is configured to instruct the plurality of memory devices to operate in a normal mode when none of the plurality of memory devices are selected for the operational monitoring.

15. A method for operating a memory module to facilitate monitoring operation of a plurality of memory devices implemented on the memory module, comprising:
determining, using a memory controller, to select a target memory device from the plurality of memory devices for operational monitoring associated with monitoring operation of the plurality of memory devices, wherein a loopback network coupled to a loopback pin is formed on the memory module, wherein the loopback network comprises the plurality of memory devices, wherein each memory device of the plurality of memory devices are coupled to each other via a loopback datapath, wherein the target memory device is selected since the target memory device stores data targeted as part of the monitoring operation, wherein the target memory device is coupled to a data pin configured to output a data signal indicative of the data when the target memory device operates in a normal mode, and wherein the target memory device is coupled to a strobe pin configured to output a strobe signal that facilitates reading the data signal output from the data pin when the first memory device operates in the normal mode;
instructing, using the memory controller, the target memory device of the plurality of memory devices to output a first loopback data signal to the loopback datapath, wherein the first loopback data signal is indicative of the data targeted as part of the monitoring operation;
instructing, using the memory controller, a transceiver in the memory module to output the first loopback data signal via the loopback pin, wherein the first loopback data signal is configured to enable the monitoring of operation of the target memory device after being output via the loopback pin; and
instructing, using the memory controller, an additional memory device of the plurality of memory devices to disable output from the additional memory device while operated in a bypass sub-mode.

16. The method of claim 15, comprising, when the target memory device operates in a normal mode:
instructing, using the memory controller, the target memory device to output a data signal to the data pin formed on the memory module; and
instructing, using the memory controller, the target memory device to output the strobe signal.

17. The method of claim 15, comprising reading, using the memory controller, a mode register to determine if a loopback mode is enabled, wherein the mode register comprises a first value when the target memory device is to be operated in a normal mode, and wherein the mode register comprises a second value when the target memory device is to be operated in the loopback mode.

18. The method of claim 15, wherein determining to select the target memory device from the plurality of memory devices comprises receiving an indication of the data targeted as part of the monitoring operation from a host controller.

19. The method of claim 15, wherein instructing the target memory device to output the first loopback data signal to the loopback datapath comprises instructing one or more additional memory devices associated with the loopback network to operate in the bypass sub-mode, and wherein the bypass sub-mode disables output from the one or more additional memory devices.

* * * * *